United States Patent
Lin et al.

(10) Patent No.: US 9,786,642 B1
(45) Date of Patent: Oct. 10, 2017

(54) LIGHT EMITTING DIODE PACKAGE SUBSTRATE AND LIGHT EMITTING DIODE PACKAGE ELEMENT

(71) Applicant: ADVANCED OPTOELECTRONIC TECHNOLOGY, INC., Hsinchu Hsien (TW)

(72) Inventors: Hou-Te Lin, Hsinchu (TW); Wen-Liang Tseng, Hsinchu (TW); Lung-Hsin Chen, Hsinchu (TW); Pin-Chuan Chen, Hsinchu (TW); Hsin-Chiang Lin, Hsinchu (TW); Chao-Hsiung Chang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 15/252,860

(22) Filed: Aug. 31, 2016

(30) Foreign Application Priority Data

May 30, 2016 (CN) .......................... 2016 1 0369914

(51) Int. Cl.
*H01L 25/16* (2006.01)
*H01L 33/50* (2010.01)
*H01L 33/60* (2010.01)
*H01L 33/48* (2010.01)
*H01L 33/62* (2010.01)
*H01L 27/02* (2006.01)
*H01L 29/866* (2006.01)

(52) U.S. Cl.
CPC .......... *H01L 25/167* (2013.01); *H01L 25/165* (2013.01); *H01L 33/486* (2013.01); *H01L 33/505* (2013.01); *H01L 33/60* (2013.01); *H01L 33/62* (2013.01); *H01L 27/0248* (2013.01); *H01L 29/866* (2013.01)

(58) Field of Classification Search
None
See application file for complete search history.

(56) References Cited

U.S. PATENT DOCUMENTS

| 2006/0113906 A1* | 6/2006 | Ogawa | C04B 35/111 |
| | | | 313/512 |
| 2007/0018191 A1* | 1/2007 | Roh | G02B 6/0073 |
| | | | 257/99 |
| 2011/0057569 A1* | 3/2011 | Wei | H05B 33/083 |
| | | | 315/122 |

* cited by examiner

*Primary Examiner* — Angel Roman
*Assistant Examiner* — Kevin Quinto
(74) *Attorney, Agent, or Firm* — Steven Reiss (57) ABSTRACT

A miniaturized LED package substrate allowing for the better installation of an electrostatic protection device includes an upper substrate, a lower substrate, and a circuit layer. The circuit layer is positioned between the upper substrate and the lower substrate and electrically connected to the upper substrate and the lower substrate. At least one cavity is defined at the lower substrate, and each of the at least one cavity passes through the lower substrate to expose a portion of the circuit layer.

9 Claims, 8 Drawing Sheets

LIGHT EMITTING DIODE PACKAGE SUBSTRATE AND LIGHT EMITTING DIODE PACKAGE ELEMENT

FIELD

The subject matter relates to semiconductor elements, particularly to a light emitting diode (LED) package substrate and a LED package element.

BACKGROUND

Electrostatic protection devices are often placed on functional areas of LED package elements to protect the LED package elements from electrostatic damage. As the size of the LED package element becomes smaller, the functional area of the LED package element becomes smaller. Thus, there is less area on the functional area of the LED package element on which to place the electrostatic protection device. Currently, there is lacking LED package substrate and element that can accommodate additional components while avoiding any detrimental effect on the emission field of the LED. Therefore, there is room for improvement in the art.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

One definition that applies throughout this disclosure will now be presented.

The term "comprising," when utilized, means "including, but not necessarily limited to"; it specifically indicates open-ended inclusion or membership in the so-described combination, group, series and the like.

Figure 1:
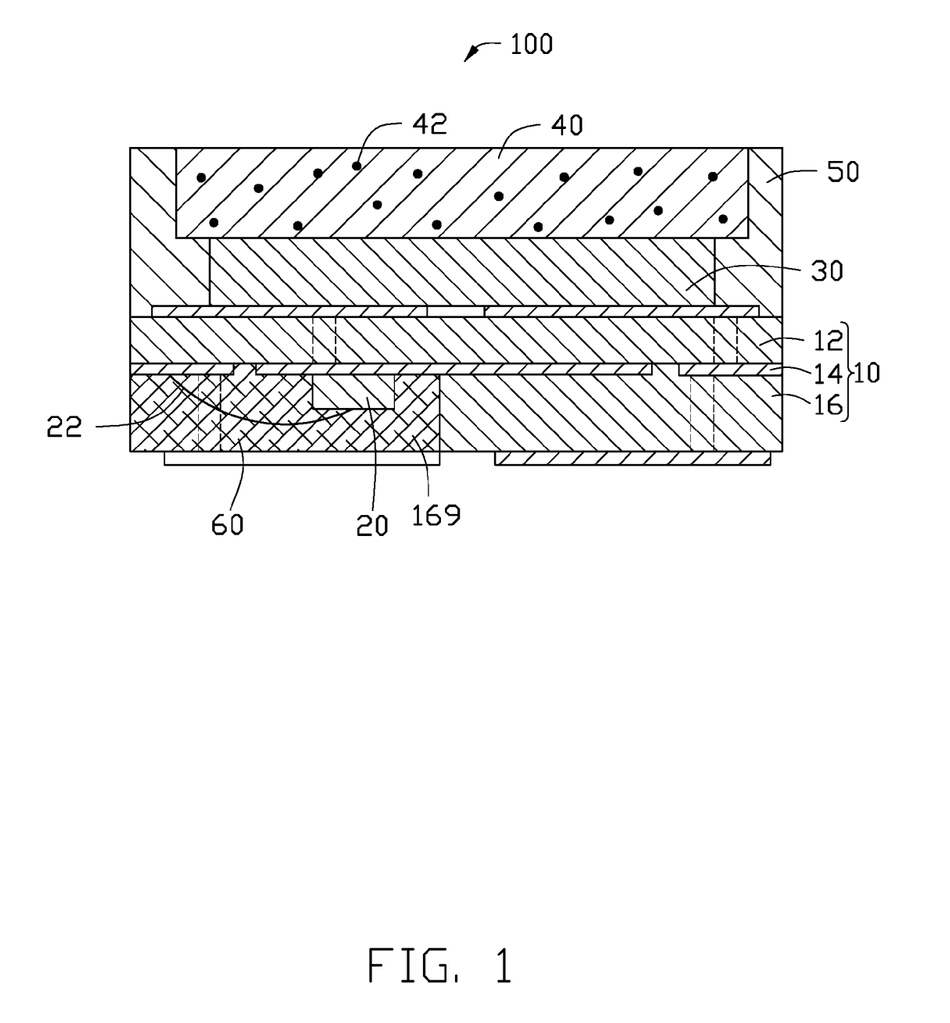
FIG. 1 is a diagrammatic view of a first exemplary embodiment of an LED package element.

FIG. 1 illustrates a first embodiment of an LED package element 100 of the present disclosure. The LED package element 100 comprises an LED package substrate 10, an electrostatic protection device 20, an LED die 30, a fluorescent layer 40, and a wrapping layer 50.

The LED package substrate 10 comprises an upper substrate 12, a circuit layer 14, and a lower substrate 16. The circuit layer 14 is sandwiched between the upper substrate 12 and the lower substrate 16.

Figure 2:
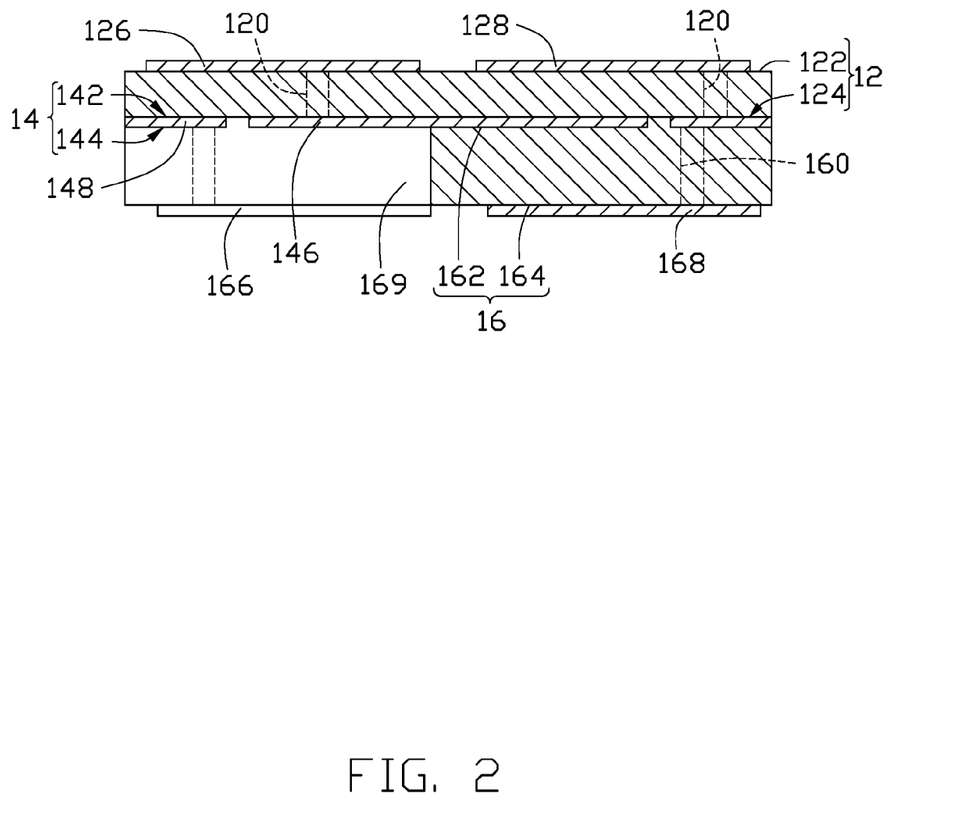
FIG. 2 is a diagrammatic view of an exemplary embodiment of an LED package substrate which may be implemented in the LED package element of FIG. 1.

FIG. 2 illustrates an exemplary embodiment of an LED package substrate 10 with an upper substrate 12 comprising a first surface 122 and an opposite second surface 124. A first electrode 126 and a second electrode 128 are positioned on the first surface 122, spaced apart from each other, and positioned around a center of the first surface 122.

The circuit layer 14 comprises a third surface 142 and an opposite fourth surface 144. The third surface 142 adheres to the second surface 124. The circuit layer 14 comprises a third electrode 146 and a fourth electrode 148.

Figure 3:
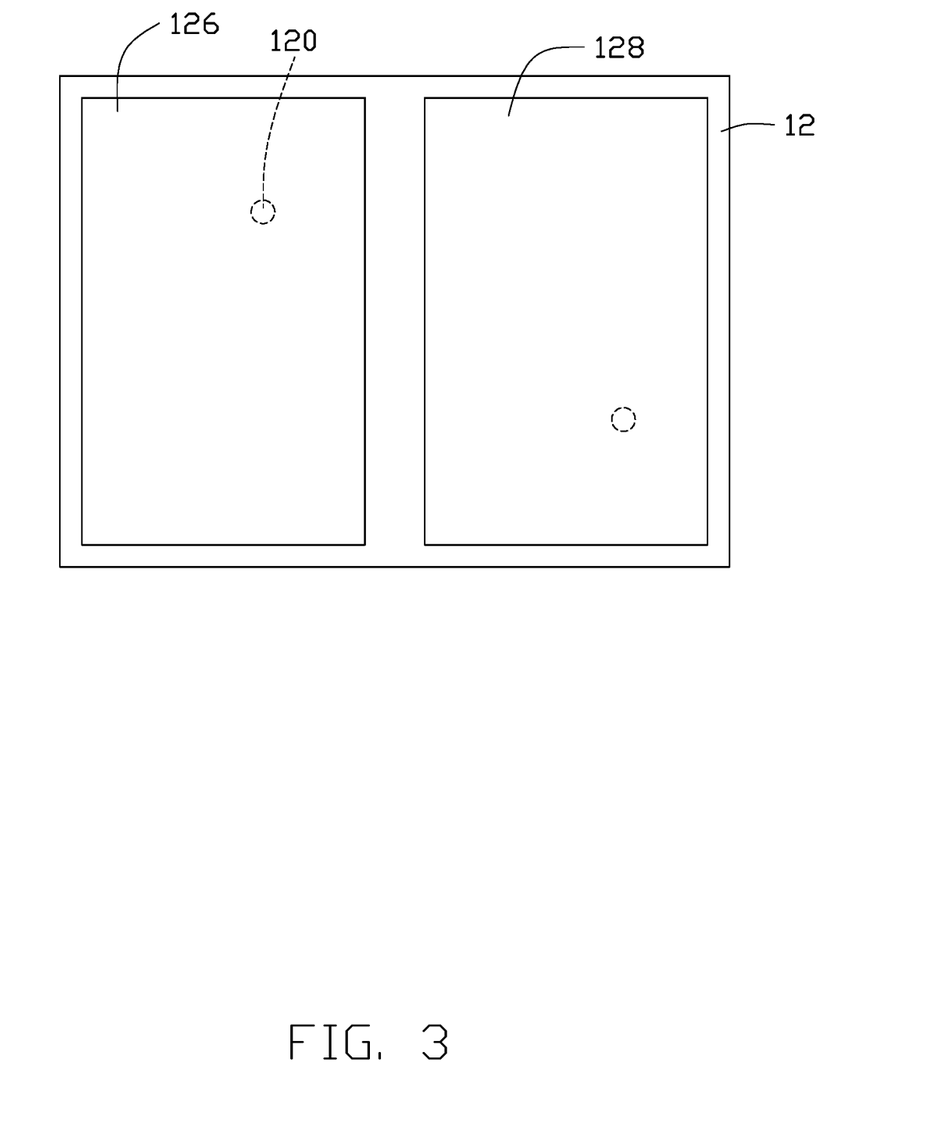
FIG. 3 is a top view of the LED package substrate of FIG. 2.

FIG. 2 and FIG. 3 show a plurality of first conductive holes 120 defined in the upper substrate 12. The first electrode 126 and the circuit layer 14 are electrically connected through at least one of the first conductive holes 120, and the second electrode 128 and the circuit layer 14 are electrically connected through the other first conductive holes 120.

Figure 4:
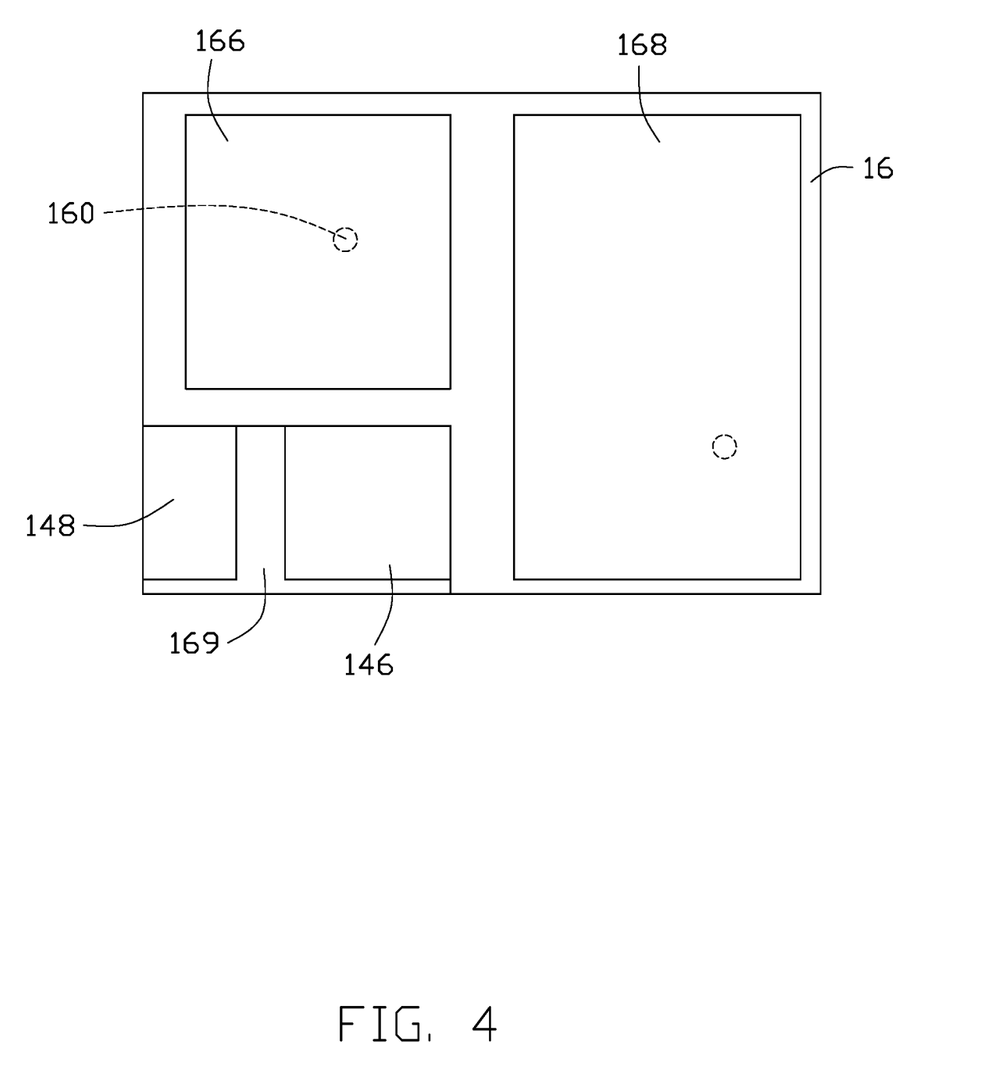
FIG. 4 is a bottom view of the LED package substrate of FIG. 2.

FIG. 2 and FIG. 4 show the lower substrate 16 comprises a fifth surface 162 and an opposite sixth surface 164. Portions of the fifth surface 162 adhere to the fourth surface 144, and other portions of the fifth surface 162 are in contact with the second surface 124. A fifth electrode 166 and a sixth electrode 168 are positioned on the sixth surface 164. The lower substrate 16 defines a cavity 169. The cavity 169 passes through the fifth surface 162 and the sixth surface 164 exposing portions of the third electrode 146 and portions of the fourth electrode 148.

A plurality of second conductive holes 160 are defined in the lower substrate 16. The fifth surface 162 and the sixth surface 164 are electrically connected through the second conductive holes 160. The fifth electrode 166 and the circuit layer 14 are electrically connected through at least one of second conductive holes 160, and the sixth electrode 168 and the circuit layer 14 are electrically connected through the other conductive holes 160.

Figure 5:
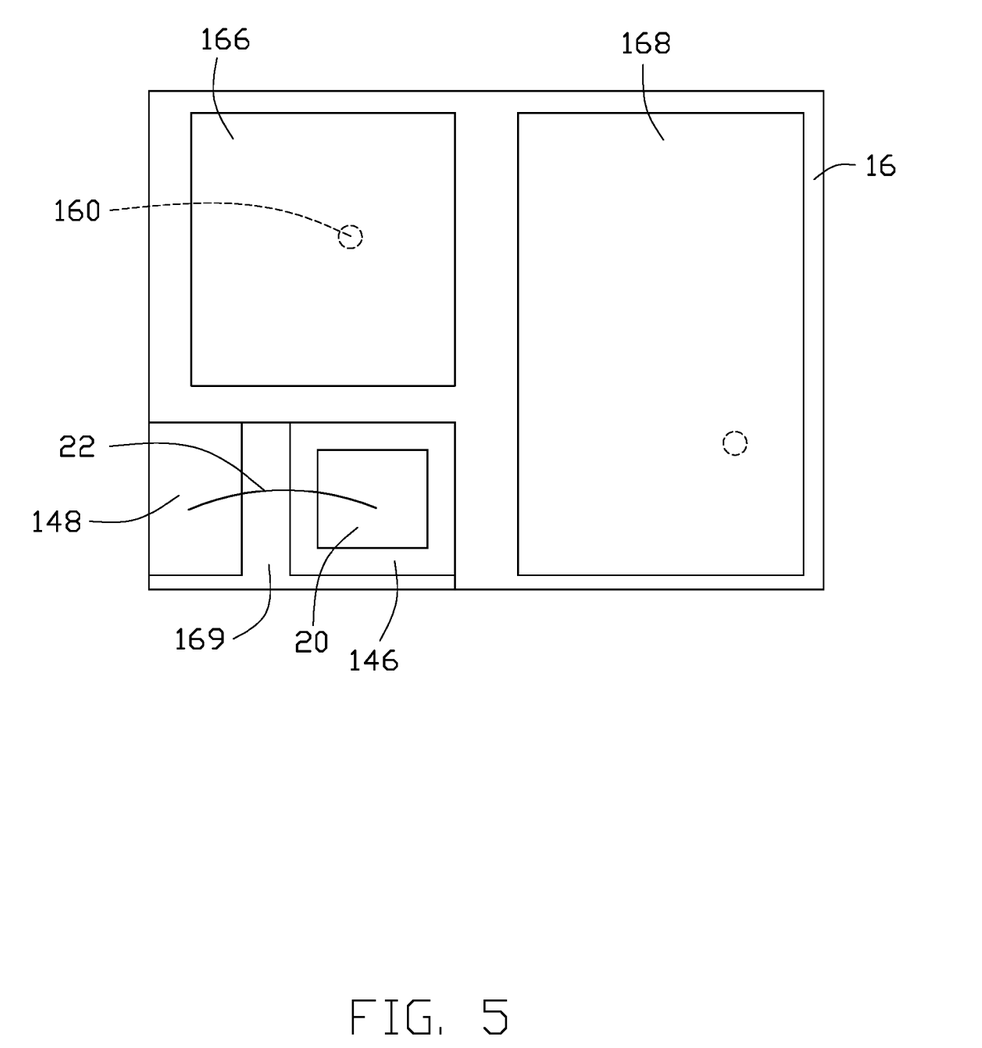
FIG. 5 is a diagrammatic view of an electrostatic protection device positioned in a cavity of the LED package substrate of FIG. 2.

FIG. 1 and FIG. 5 illustrate the electrostatic protection device 20 received in the cavity 169. In the illustrated exemplary embodiment, the electrostatic protection device 20 is a Zener diode. The electrostatic protection device 20 is mounted on the fourth surface 144 and electrically connected to the third electrode 146. The electrostatic protection device 20 further connected to the fourth electrode 148 by a wire 22.

Figure 6:
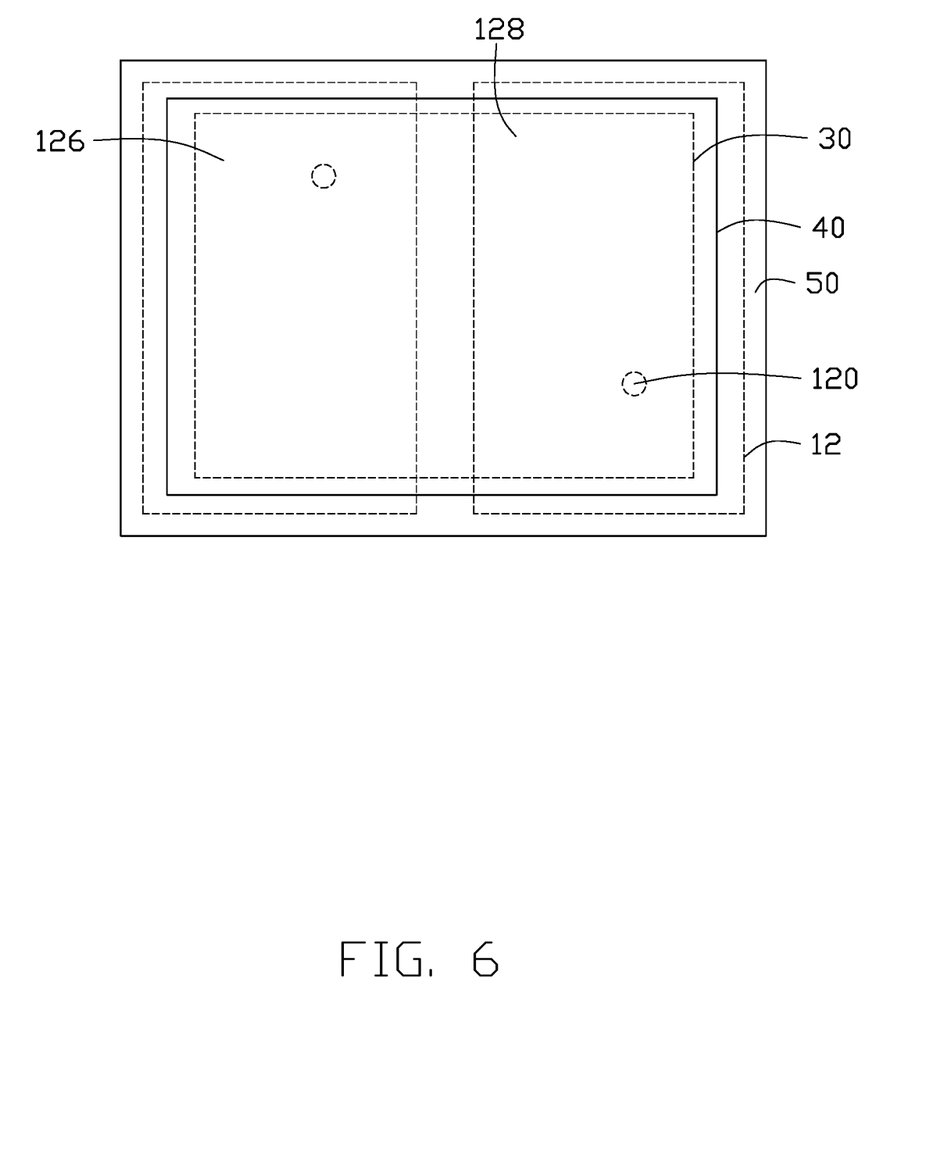
FIG. 6 is a top view of an LED package element of FIG. 1.

FIG. 1 and FIG. 6 illustrate the LED die 30 as being substantially rectangular. The LED die 30 adheres to the center of the first surface 122. The LED die 30 is fixed to and electrically connected to the first electrode 126 and the second electrode 128. A ratio between the sizes of an area of a bottom surface of the LED 30 and an area of the first surface 122 is greater than 75%. An area size of a light emitting surface of the LED die 30 and the size of the area of the first surface 122 is in a ratio between 0.75:1 and 1:1.

FIG. 1 illustrates the fluorescent layer 40 positioned on the LED die 30. FIG. 6 illustrates an area size of a bottom surface of the fluorescent layer 40 as being larger than the area size of the light emitting surface of the LED die 30. The fluorescent layer 40 has a plurality of fluorescent particles 42. The fluorescent particles 42 react to the light beam from the LED die 30 to form a complementary light beam which comprises of a color complementary to the light beam from the LED die 30. The complementary light beam is mixed with the light beam from the LED die 30 to form white light.

The wrapping layer 50 wraps around the LED die 30 and the fluorescent layer 40. The wrapping layer 50 is configured to fix the LED die 30 and the fluorescent layer 40 to the LED package substrate 10. An inner surface of wrapping layer 50 can reflect the light beam from the LED die 30 towards the fluorescent layer 40.

Furthermore, the LED element package element 100 comprises a cover layer 60. The cover layer 60 fills in the cavity 169 and covers the electrostatic protection device 20.

Since the cavity 169 in the above configuration is positioned in the lower substrate 16 of the LED substrate 10 to accommodate the electrostatic protection device 20, there is enough area to receive the LED electrostatic protection device 20 even if size of the LED die 30 is decreased. The electrostatic protection device 20 is not positioned on the upper substrate 12 on which the LED die 30 is placed, thereby avoiding any detrimental effect on the emission field of the LED die 30 by the electrostatic protection device 20. This also ensures that the LED die 30 is located in the center of the first surface 122. A position of the LED die 30 on the upper substrate 12 does not need to be adjusted to accommodate the electrostatic protection device 20, thereby further preventing any detrimental effect on the light emitting field of LED die 30 by the electrostatic protection device 20. Furthermore, this prevents the light beam from the LED die 30 from being absorbed by the electrostatic protection device 20.

Figure 7:
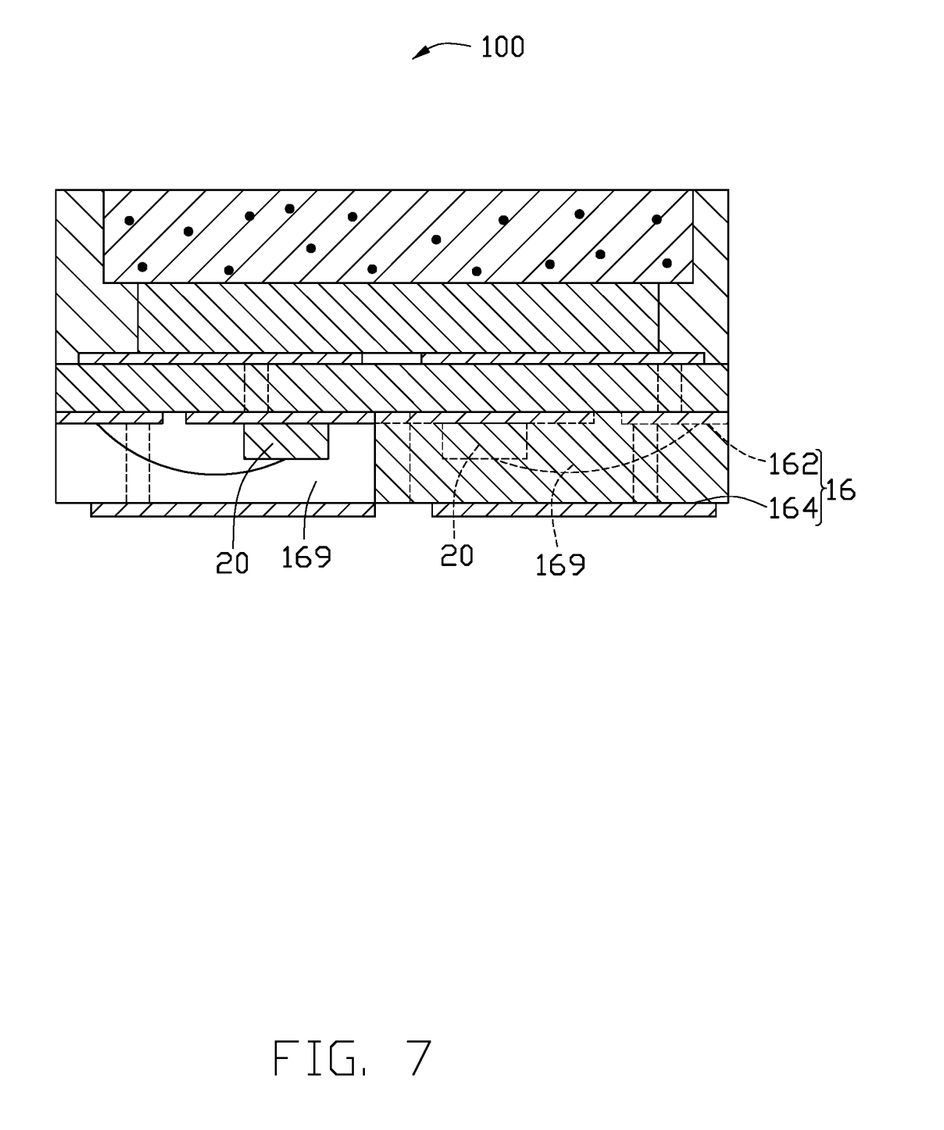
FIG. 7 is a diagrammatic view of a second embodiment of an LED package element.
Figure 8:
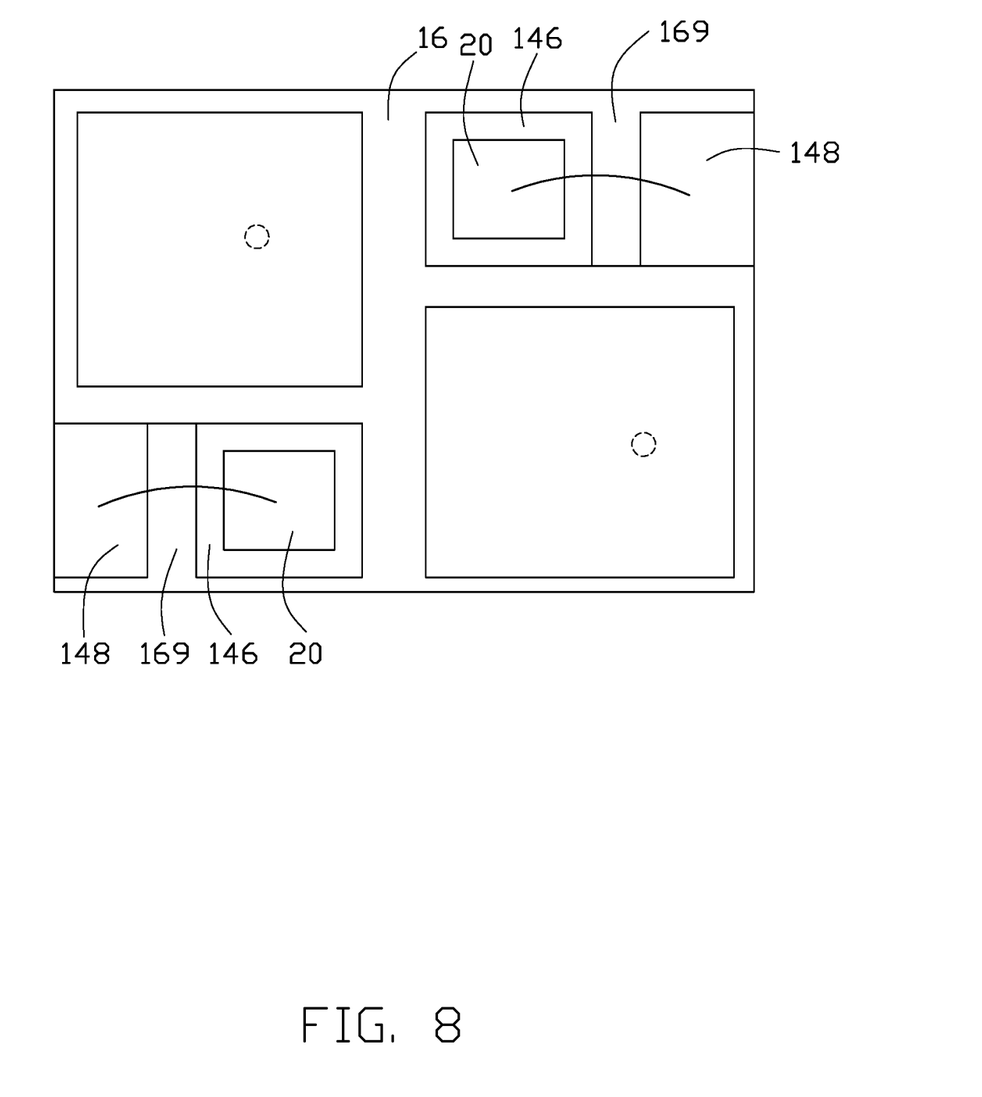
FIG. 8 is a bottom view of the LED package element of FIG. 7.

FIG. 7 and FIG. 8 illustrate a second embodiment of a LED package element 200. One difference as compared to the first embodiment of the LED package element 100 is that the LED package element 200 has two cavities 169 defined in the lower substrate 16. The two cavities 169 pass through the fifth surface 162 and the sixth surface 164 to expose the third electrode 146 and the fourth electrode 148. The two cavities 169 are positioned along a diagonal line of the lower substrate 16. The LED package element 200 comprises two electrostatic protection devices 20. The two electrostatic protection devices 20 are received in the two cavities 169.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A light-emitting diode package substrate comprising:
    an upper substrate having a first electrode and a second electrode positioned thereon;
    a circuit layer comprising a third electrode and a fourth electrode;
    a lower substrate having a fifth electrode and a sixth electrode positioned thereon, the lower substrate defining at least one cavity, the lower substrate further defining a plurality of conductive holes; and
    at least one electrostatic protection device accommodated within the at least one cavity;
    wherein the circuit layer is positioned between the upper substrate and the lower substrate and electrically connected to the upper substrate and the lower substrate, each of the at least one cavity passes through the lower substrate to expose a portion of the circuit layer;
    wherein each of the fifth and sixth electrodes is electrically connected to the circuit layer through one of the plurality of conductive holes; and
    wherein one of the plurality of conductive holes passes through the at least one cavity.

2. The LED package substrate of claim 1, the first electrode is electrically connected to the third electrode; the second electrode is electrically connected to the fourth electrode; wherein the at least one cavity exposes a portion of the fifth electrode and the sixth electrode.

3. The LED package substrate of claim 2, wherein a plurality of conductive holes is defined in the upper substrate; the plurality of conductive holes in the upper substrate is electrically connected to the first electrode, the second electrode, the third electrode, and the fourth electrode.

4. A light-emitting diode package element comprising:
    a light-emitting diode package substrate comprising:
        an upper substrate;
        a lower substrate comprising two electrodes; and
        a circuit layer positioned between the upper substrate and the lower substrate and electrically connected to the upper substrate and the lower substrate, at least one cavity defined in the lower substrate, at least one electrostatic protection device accommodated within the at least one cavity, each of the at least one cavity passing through the lower substrate to expose a portion of the circuit layer, a plurality of conductive holes further defined in the lower substrate;
    at least one Zener diode received in each cavity and electrically connected to the circuit layer, the at least one Zener diode having an electrostatic protection function; and
    an LED die positioned on a first surface of the upper substrate and electrically connected to the light-emitting diode packaged substrate;
    wherein each of the two electrodes of the lower substrate is electrically connected to the circuit layer through one of the plurality of conductive holes; and
    wherein one of the plurality of conductive holes passes through the at least one cavity.

5. The LED package element of claim 4, wherein an area of a bottom surface of the LED and an area of the first surface is in a ratio greater than 75%.

6. The LED package element of claim 4, further comprising a cover layer filling the cavity and covering the electrostatic protection device.

7. The LED package element of claim 4, further comprising a fluorescent layer positioned on the LED die; wherein the fluorescent layer comprises a plurality of fluorescent particles; the fluorescent particles are triggered by the light beam from the LED die to form a complementary light beam which comprises a light color complementary to the light beam from the LED die; wherein the complementary light beam is mixed with the light beam from the LED die to form white light.

8. The LED package element of claim 7, further comprising a wrapping layer disposed on the upper substrate to wrap around the LED die.

9. The LED package element of claim 8, wherein an inner surface of the wrapping layer is able to reflect the light beam from the LED die emits towards the fluorescent layer.

* * * * *